United States Patent
Lee (10) Patent No.: US 8,743,642 B2
(45) Date of Patent: *Jun. 3, 2014

(54) DATA SERIALIZERS, OUTPUT BUFFERS, MEMORY DEVICES AND METHODS OF SERIALIZING

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

This patent is subject to a terminal disclaimer.

(21) Appl. No.: 13/491,311

(22) Filed: Jun. 7, 2012

(65) Prior Publication Data

US 2012/0243361 A1    Sep. 27, 2012

Related U.S. Application Data

(63) Continuation of application No. 12/500,207, filed on Jul. 9, 2009, now Pat. No. 8,203,900.

(51) Int. Cl.
    *G11C 7/00* (2006.01)
(52) U.S. Cl.
    USPC .................. 365/219; 365/189.05; 365/233.11
(58) Field of Classification Search
    USPC ................. 365/219, 233.11, 189.05
    See application file for complete search history.

(56) References Cited

U.S. PATENT DOCUMENTS

| | | | |
|---|---|---|---|
| 7,042,245 B2 | 5/2006 | Hidaka | |
| 7,149,142 B1* | 12/2006 | Fisher et al. | 365/229 |
| 7,362,646 B2* | 4/2008 | Otsuka et al. | 365/226 |
| 7,382,674 B2* | 6/2008 | Hirabayashi | 365/226 |
| 7,397,721 B2 | 7/2008 | Lee | |
| 7,609,581 B2* | 10/2009 | Otsuka et al. | 365/226 |
| 8,203,900 B2* | 6/2012 | Lee | 365/219 |
| 2011/0007591 A1 | 1/2011 | Lee | |

* cited by examiner

*Primary Examiner* — Pho M Luu
(74) *Attorney, Agent, or Firm* — Dorsey & Whitney LLP (57) ABSTRACT

Data serializers, output buffers, memory devices and methods for serializing are provided, including a data serializer that may convert digits of parallel data to a stream of corresponding digits of serial data digits. One such data serializer may include a logic system receiving the parallel data digits and clock signals having phases that are equally phased apart from each other. Such a data serializer may use the clock signals to generate data sample signals having a value corresponding to the value of a respective one of the parallel data digits and a timing corresponding to a respective one of the clock signals. The data sample signals may be applied to a switching circuit that includes a plurality of switches, such as respective transistors, coupled to each other in parallel between an output node and a first voltage.

20 Claims, 8 Drawing Sheets

DATA SERIALIZERS, OUTPUT BUFFERS, MEMORY DEVICES AND METHODS OF SERIALIZING

CROSS REFERENCE TO RELATED APPLICATION(S)

This application is a continuation of U.S. patent application Ser. No. 12/500,207, filed Jul. 9, 2009, and issued as U.S. Pat. No. 8,203,900. This application and patent are incorporated herein by reference in their entirety, for any purpose.

TECHNICAL FIELD

Embodiments of this invention relate to integrated circuit devices, and, more particularly, to data serializers, output buffers using data serializers and memory devices using such output buffers.

BACKGROUND OF THE INVENTION

Data serializers are well-known in a common use in various electronic devices. The function of a data serializer is to convert parallel data into a corresponding stream of serial data. Data serializers are sometimes used in integrated circuit devices where data may be coupled to or from an electronic device at a significantly faster rate than the data can be processed within the device. For example, in integrated memory devices, data may be coupled to or from a memory device at a rate that may be significantly faster than the rate at which the data may be serially processed in the memory device. In such case, for example, read data may be provided by an array of memory cells in the memory device as a large number of parallel digits (e.g., bits), which are converted to a corresponding stream of serial data and output through a serial data port.

Although the design parameters of serializers may vary for different applications, two design parameters that may be considered for memory devices are power consumption and operating speed. Operating speed may be important to allow read data to be transmitted from a memory device with a high data bandwidth. Low power consumption may be important in various applications, such as where a memory device is used in a battery-powered electronic system, such as a laptop computer.

Prior art serializers typically may use a sampling circuit, such as a latch, for each parallel data that is to be serialized. Thus, for example, 16 sampling circuits may be used to convert 16 digits of parallel data to a corresponding serial stream. The sampling circuit may obtain a sample of the data digit and output the sample at an output node responsive to a transition of a received clock signal. Each sampling circuit may receive a clock signal having a different phase. The output nodes of all of the sampling circuits used in the serializer may be connected to each other so that the sampling circuits sequentially apply the respective samples to the output nodes.

Prior art sampling circuits may typically use an output stage having several transistors connected to the output node of the sampling circuit. As a result, the capacitance of the output node may be fairly large. The capacitance is further increased because Prior art sampling circuits may typically switch the output node between two voltages. Further, since the output nodes of a large number of sampling circuits may be coupled to each other, the capacitance at the output nodes of the sampling circuits are connected to each other in parallel, thus resulting in a substantial capacitance at the combined output nodes.

The large capacitance that may be present at the output node of a serializer may limit the operating speed of the serializer, thereby potentially limiting the data bandwidth of the memory device. Additionally, a large capacitance may require that serializers provide larger currents to drive the output node, thereby potentially resulting in increased power consumption. In fact, higher operating speeds may sometimes only be achieved at the expense of increased power consumption.

DETAILED DESCRIPTION

Figure 1:
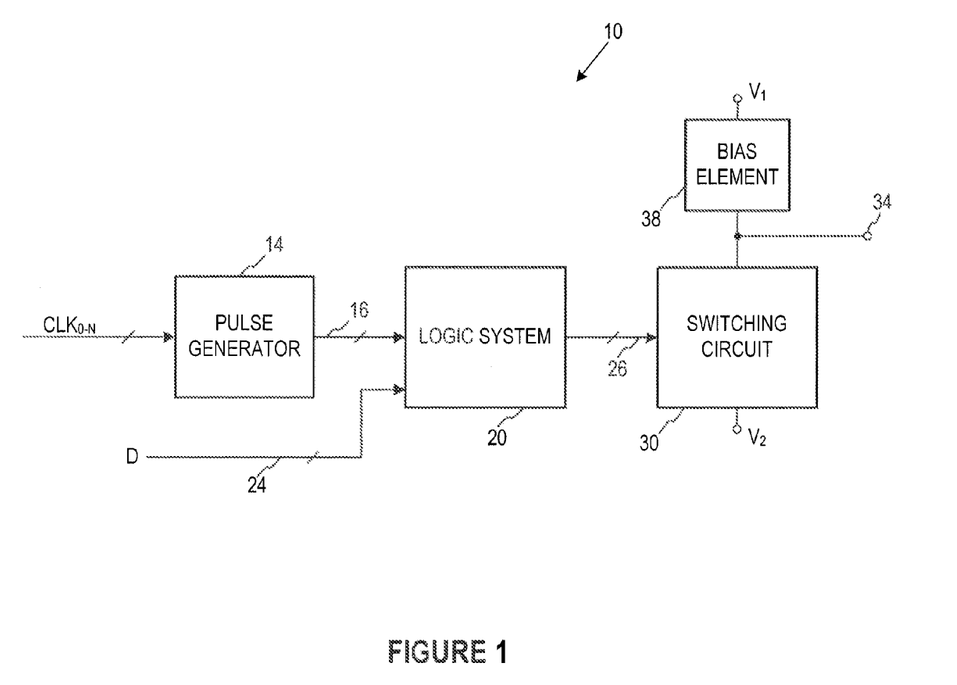
FIG. 1 is a block diagram of one embodiment of a data serializer for converting parallel data to serial data.

An embodiment of a serializer 10 is shown in FIG. 1. The serializer 10 includes a pulse generator 14 that may receive a plurality of clock signals $CLK_{0-N}$. The clock signals $CLK_{0-N}$ may have phases that are staggered relative to each other. For example, for an 8-digit serializer, the clock signals may have phases of 0, 45, 90, 135, 180, 225, 270 and 315 degrees. Serializes for different numbers of digits may, of course, receive clock signals having a different set of phases. In the embodiment shown in FIG. 1, the pulse generator 14 may generate a pulse responsive to a particular translation of each clock signal $CLK_{0-N}$, and apply the pulse to a respective output node 16. For example, the pulse generator 14 may generate a pulse on a respective one of the output nodes 16 responsive to the rising edge of each clock signal $CLK_{0-N}$. The pulses generated by the pulse generator 14 may transition from a low level to a high level in some embodiments, and from a high level to a low level in other embodiments. Also, some embodiments may use two or more clock signals $CLK_{0-N}$ to generate each pulse, such as by generating a pulse during the period between when a respective clock signal transitions and a clock signal with an adjacent phase transitions.

The pulses from the pulse generator 14 may be applied to a logic system 20, which may also receive N parallel digits of data D through a bus 24. The logic system 20 may include, for example, a set of logic devices, such as a set of NOR gates or NAND gates. The logic system 20 may output a sample signal for each digit of the data D on a bus 26 responsive to a respective one of the pulses from the pulse generator 14. For example, the logic system 20 may output a first sample signal corresponding to a first digit of data responsive to the first pulse, a second sample signal corresponding to a second digit of data responsive to the second pulse, and so forth until the last sample signal is output corresponding to the final digit of data responsive to the last pulse.

The sample signals from the logic system 20 may be coupled through the bus 26 to a switching circuit 30. The switching circuit 30 may include an output node 34 that is biased to a first voltage $V_1$, such as a supply voltage $V_{CC}$, through a bias element 38, such as a resistor, transistor or other circuit component. The switching circuit 30 may include a respective switch (not shown) for each of the sample signals from the logic system 20. The switches may be coupled to each other in parallel between the output node 34 and a second voltage $V_2$, such as ground.

In operation, the sample signals may be applied to the switching circuit 30 staggered over respective times corresponding to the staggered times of the pulses from the pulse generator 14 which, in turn, correspond to the phases of the clock signals $CLK_{0-N}$. As mentioned above, the value of each of the sample signals corresponds to the value of a respective one of the digits of data D. For example, if the respective digit of data has a logic "0" level, the sample signal may have a low value, and if the respective digit of data has a logic "1" level, the sample signal may have a high value. However, other relationships may be used in other embodiments. Each of the switches in the switching circuits 30 may be responsive to a respective one of the sample signals. For example, the switches may close responsive to respective sample signals having a first value thereby driving the output node 34 to the second voltage $V_2$. Conversely, the switches may open responsive to respective sample signals having a second value, thereby allowing the output node 34 to be driven to the first voltage $V_1$ through the bias element 38. Although the switching circuit 30 may use a set of parallel switches as mentioned above, other components may be used in other embodiments.

Figure 2:
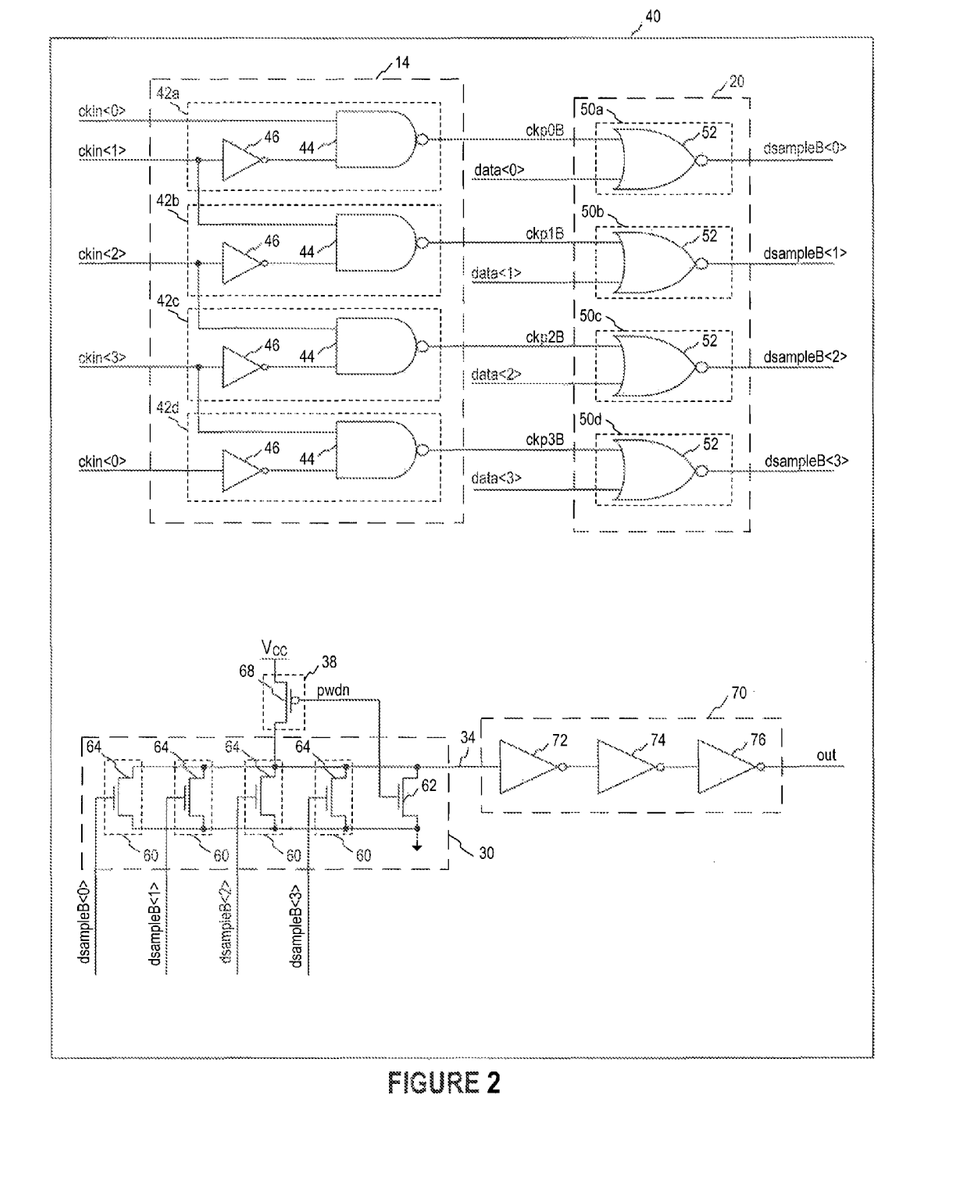
FIG. 2 is a block diagram of a data serializer according to another embodiment configured to convert 4 parallel data digits to 4 serial data digits.

Another embodiment of a serializer 40 is shown in FIG. 2. The serializer 40 may be configured to convert four digits of parallel data into a 4-digit serial data stream. The serializer 40 includes the pulse generator 14, which, in the embodiment shown, may use four pulse generator circuits 42a,b,c,d for generating respective pulses responsive to four clock signals ckin<0>, ckin<1>, ckin<2>, ckin<3>. Insofar as the serializer 40 receives 4 clock signals ckin<0-3>, the clock signals may have phases that are staggered by 90 degrees. Each of the pulse generator circuits 42a-d may include a NAND gate 44 having an input receiving a respective clock signal and an inverter 46 receiving clock signals having a respective adjacent phase. The output of the inverter 46 may be applied to another input of the NAND gate 44.

Figure 3:
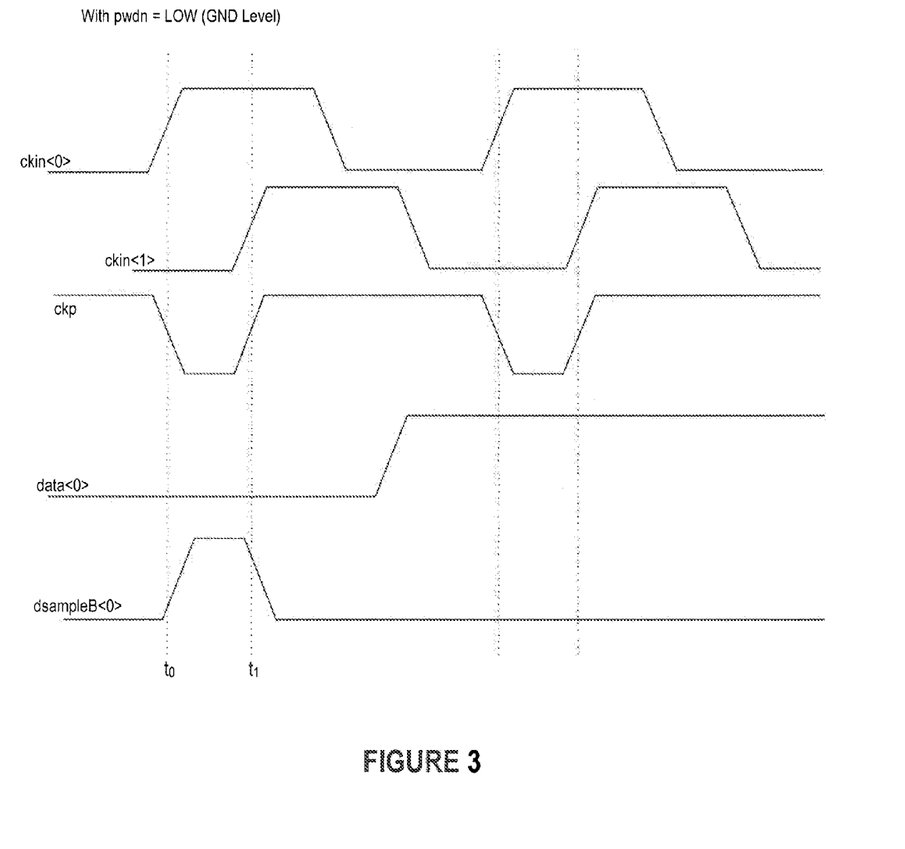
FIG. 3 is a timing diagram showing some of the signals that may be present in the serializer of FIG. 2.

The operation of the pulse generator circuit 42a will be explained with reference to the timing diagram of FIG. 3, it being understood that the other pulse generator circuits 42b-d may operate in the same manner. The clock signal ckin<0> is normally low, thereby causing the NAND gate 44 to which it is applied to output a high level. As also shown in FIG. 3, the clock signal with the adjacent phase, i.e., ckin<1>, is also normally low, so that the inverter 46 may apply a high level to the NAND gate 44. Nevertheless, the output of the NAND gate 44 may remain high because of the low ckin<0> signal. At time $t_0$, the ckin<0> signal may transition high, thereby causing the output of the NAND gate 44 to transition the ckp0B signal at its output low since the output of the inverter 46 remains high. However, at time $t_1$, the clock signal ckin<1> having the adjacent phase transitions high, thereby causing the inverter 46 to apply a low to the input of the NAND gate 44. The ckp0B signal at the output of the NAND gate then transitions high. Thus, the signal ckp0B at the output of the pulse generator circuit 42a is a negative-going pulse that starts responsive to the rising edge of its respective clock signal ckin<0> and ends responsive to the rising edge of the adjacent clock signal ckin<1>. The other pulse generator circuits 42b-d likewise generate respective negative-going pulses ckp1B-ckp3B that start responsive to the rising edge of their respective clock signals ckin<1-3> and end responsive to the rising edge of the respective adjacent clock signals ckin<2,3,0>. As a result, the pulse generator 14 generates 4 pulses ckp0B-ckp3B equally phased apart from each other by 90 degrees.

The pulses ckp0B-ckp3B from the pulse generator 14 are applied to the logic system 20 which, in the embodiment shown in FIG. 2, is implemented using 4 logic circuits 50a-d, each of which receives a respective one of the pulses ckp0B-ckp3B. In the embodiment shown in FIG. 2, each of the logic circuits 50a-d is implemented using a respective logic device, such as a NOR gate 52. The NOR gate 52 may have two inputs, one of which may receive a respective one of the pulses ckp0B-ckp3B and the other of which may receive a respective digit of data<0-3>. As explained in greater detail below, the logic circuits 50a-d may output respective sample signals dsampleB<0-3> corresponding to the level of respective data digits data<0-3>.

The operation of the logic system 20 will be explained for only the logic circuit 50a by again referring to FIG. 2, it being understood that the other logic circuits 50b-d may operate in the same manner as the logic circuit 50a. The NOR gate 52 is enabled to respond to the data digit data<0> by the negative-going pulse ckp0B. If the data digit data<0> is low, the NOR gate 52 may output a high sample signal dsampleB<0> responsive to the pulse ckp0B at time $t_0$. Conversely, if the data digit data<0> is high, the NOR gate 50 may output a low sample signal dsampleB<0> responsive to the pulse ckp0B at time $t_0$. Insofar as the pulses ckp0B-ckp3B may be equally phased apart from each other by 90 degrees, the logic circuits 50a-d may collectively output four sample signals dsampleB<0-3> at different times that are equally phased apart from each other by 90 degrees.

The sample signals dsampleB<0-3> from the logic system 20 may be applied to the switching circuit 30, which, in the embodiment shown in FIG. 2, is implemented using four parallel switches 60 and one NMOS transistor 62 connected in parallel with the switches 60. In the embodiment shown in FIG. 2, the switches 60 are implemented using respective NMOS transistors 64 having their respective sources connected to each other and to the output node 34 and their respective drains connected to each other and to ground. The gates of the transistors 64 may be coupled to receive a respective one of the sample signals dsampleB<0-3>. The gate of the transistor 62 may be coupled to receive a control signal pwdn, which may be active high during power down to maintain the output node 34 at ground.

The serializer 40 may also include the bias element 38, which, in the embodiment shown in FIG. 2 may be implemented with a PMOS transistor 68 that may also receive the signal pwdn at its gate. As mentioned above, the signal pwdn is active high during power down, but may be low during operation of the serializer 40 to turn ON the PMOS transistor 68 to bias the output node 34 to $V_{CC}$ through the transistor 68.

Figure 4:
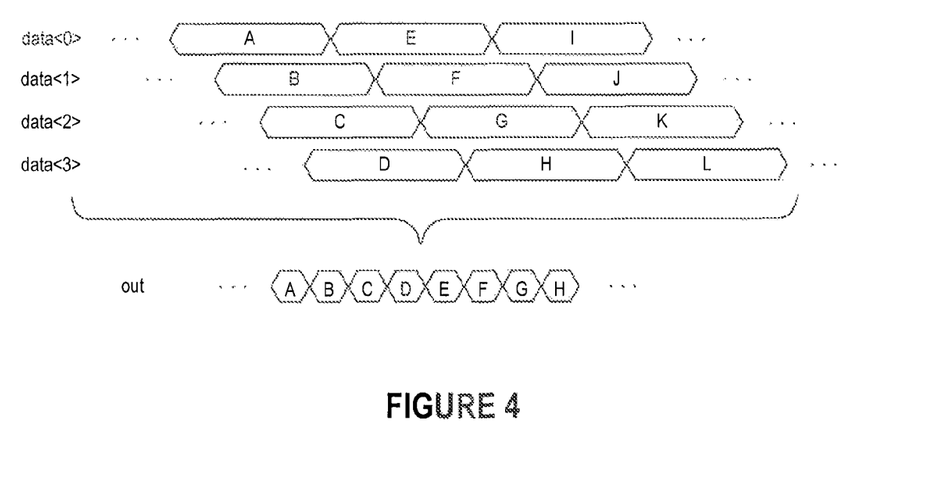
FIG. 4 is a timing diagram showing a serial stream of data digits derived from a set of parallel data digits, which are also shown in FIG. 4.

In operation, each sample signal dsampleB<0-3> having a high level corresponding to a respective data digit data<0-3> having a logic "0" level causes the respective transistor 64 to turn ON, thereby driving the output node 34 to ground. On the other hand, each sample signal dsampleB<0-3> having a low level corresponding to a respective data digit data<0-3> having a logic "1" level allows the respective transistor 64 to remain OFF, thereby allowing the PMOS transistors 68 to maintain the output node 34 at $V_{CC}$. Insofar as the sample signals dsampleB<0-3> maybe generated at respective times corresponding to the staggered phases of the clock signals ckin<0-3>, a serial stream of data digits corresponding to the parallel data digits data<0> may be provided at the output node 34, as shown in FIG. 4.

As mentioned above, prior art serializers may use circuitry in which a relatively large number of transistors are coupled to an output node, thereby resulting in a relatively large capacitance at the output node. This relatively high capacitance may be caused not only by the number of transistors coupled to the output node, but also by the fact that the transistors may include switching PMOS transistors in addition to switching NMOS transistors. The use of switching transistors, in comparison with a transistor biased ON like the transistors 68, may result in a relatively large capacitance at the output node 34. The switching circuit 30 used in the embodiment of FIG. 2 may have a relatively low capacitance at the output node 34 because only one transistor 64 is connected to the output node 34 for each digit of data, in addition to the two transistors 62, 68. Moreover, since only the transistors 64 receiving the sample signals dsampleB<0-3> are switched and the NMOS transistor 62 and PMOS transistors 68 may not be switched, the capacitance at the output node 34 is further minimized.

In the embodiment shown in FIG. 2, the serializer 40 may also include a buffer 70 implemented using three series-coupled inverters 72, 74, 76, the last of which 76 provides a serial data signal out. Insofar as the switching circuit 30 acts as an inverter, the use of an odd number of inverters 72-76 means the serial data out may, like the sample signals dsampleB<0-3>, have signal levels corresponding to the complement of the respective data digits data<0-3>.

Figure 5:
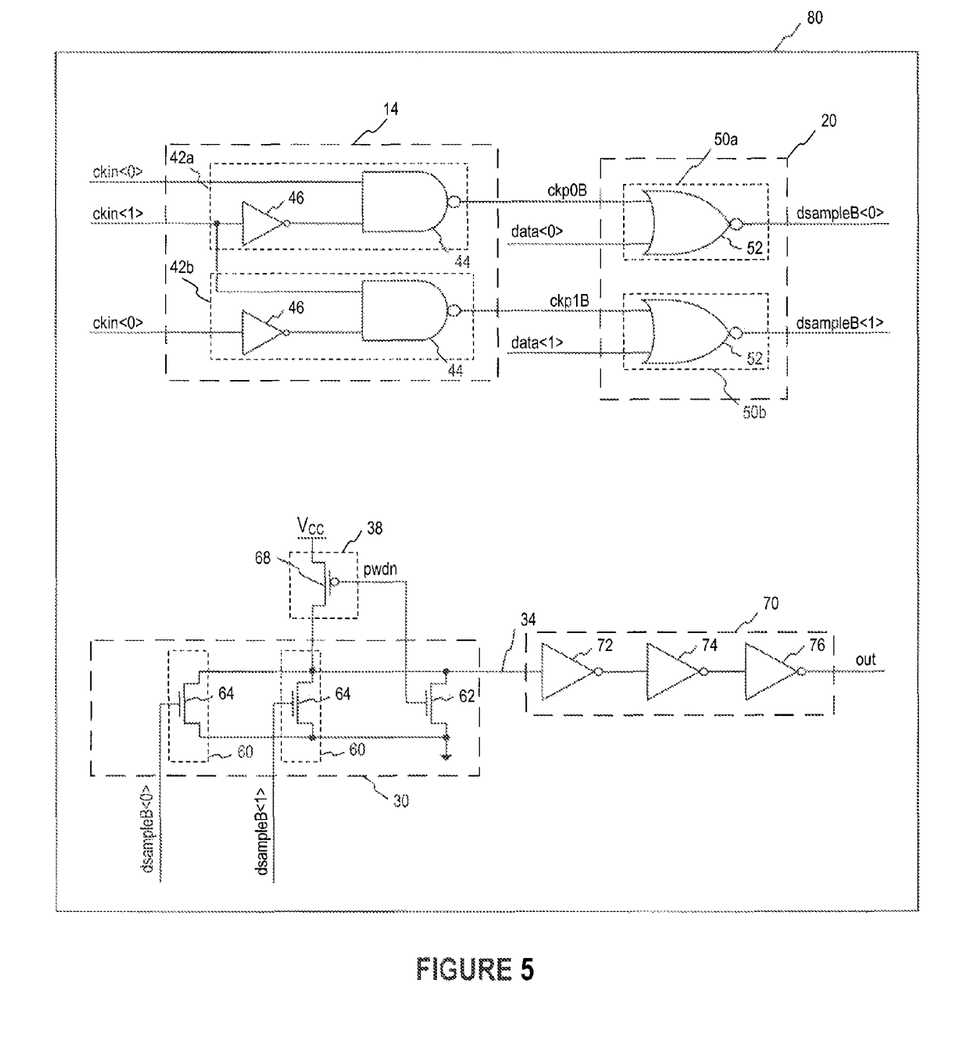
FIG. 5 is a block diagram of a data serializer according to another embodiment configured to convert 2 parallel data digits to 2 serial data digits.

Another embodiment of a serializer 80 is shown in FIG. 5. The serializer 80 is configured for converting 2 parallel data digits data<0,1> into two serial data digits. The serializer 80 includes two of the pulse generator circuits 42a,b that are used in the serializer 40 of FIG. 2. The pulse generator circuits 42a,b may each receive respective clock signals ckin<0> and ckin<1>, which may be phased 180 degrees from each other, and they may generate respective pulses ckp0B and ckp1B responsive thereto. The pulse generator circuits 42a,b may apply the respective pulses ckp0B and ckp1B to two of the same logic circuits 50a,b that are used in the serializer 40 of FIG. 2. The logic circuits 50a,b may generate respective sample signals dsampleB<0> and dsampleB<1> responsive to the respective pulses ckp0B and ckp1B. The sample signals dsampleB<0> and dsampleB<1> may be applied to the switching circuit 30, which, like the switching circuit 30 used in the serializer 40 of FIG. 2, may use switches 60 implemented with respective NMOS transistors 64. The switches 60 may be coupled to the output node 34, which may be biased high through the bias element 38.

The pulse generator circuits 42a,b, logic circuits 50a, and switches 60 used in the switching circuit 30 may operate in essentially the same manner as the pulse generator circuits 42a,b, logic circuits 50a,b and switches 60 used in the serializer 40 of FIG. 2. Therefore, in the interest of brevity and clarity, an explanation of their function and operation will not be repeated other than to mention that the serial data out may be composed of alternating serial data digits corresponding to sets of two parallel data digits data<0-1>.

Figure 6:
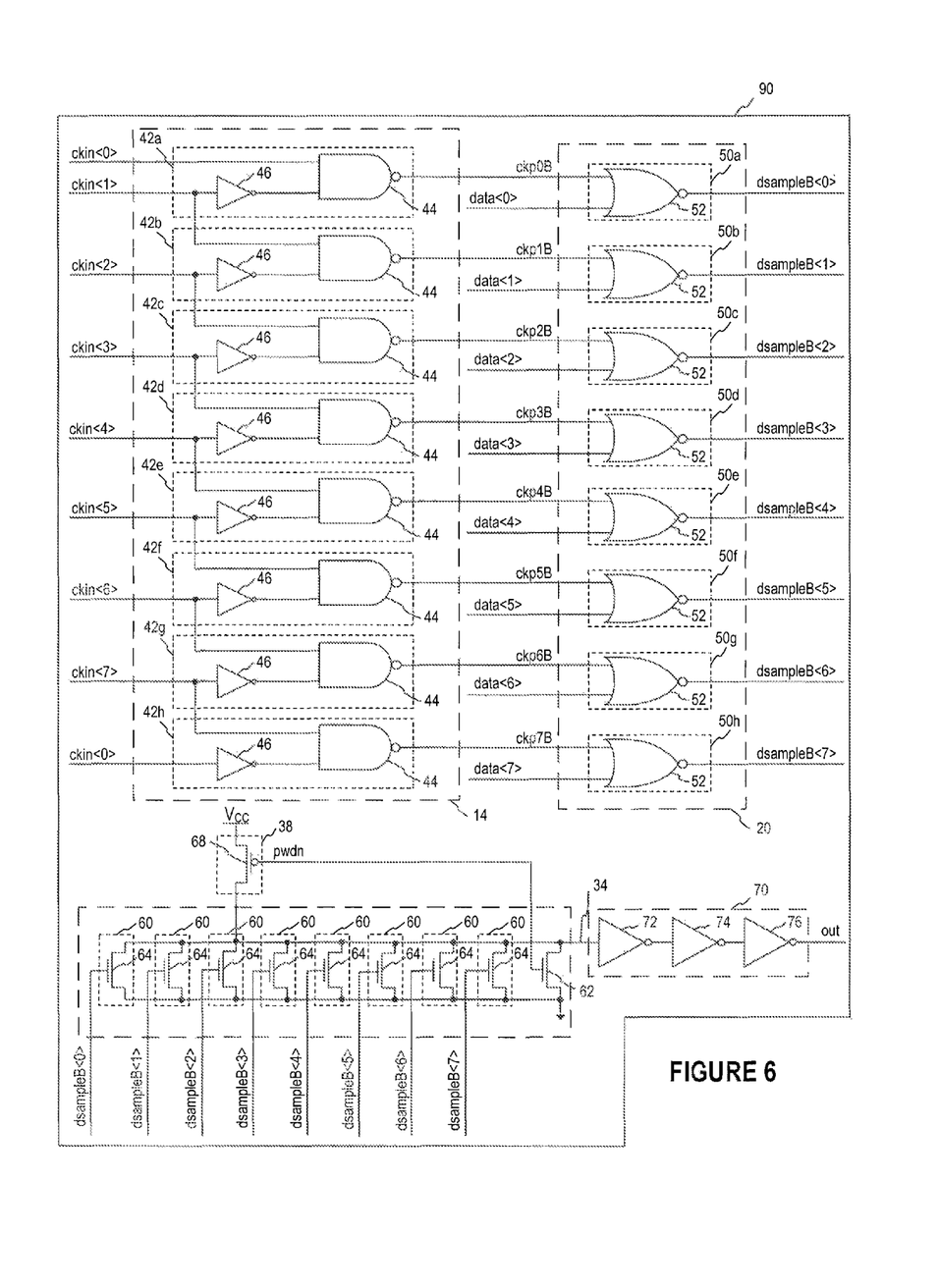
FIG. 6 is a block diagram of a data serializer according to still another embodiment configured to convert 8 parallel data digits to 8 serial data digits.

Another embodiment of a serializer 90 is shown in FIG. 6. The serializer 90 is configured for converting 8 parallel data digits data<0-7> into eight serial data digits. The serializer 90 may include eight of the pulse generator circuits 42a-h receiving respective dock signals ckin<0-7, which may be phased 45 degrees from each other. The pulse generator circuits 42a-h may generate respective pulses ckp0B-ckp7B responsive to the respective clock signals ckin<0-7. The pulse generator circuits 42a-h may apply the respective pulses ckp0B-ckp7B to eight of the logic circuits 50a-h. The logic circuits 50a-h may generate respective sample signals dsampleB<0-7> responsive to the respective pulses ckp0B-ckp7B. The sample signals dsampleB<0-7> may be applied to the switching circuit 30, which, may use eight switches 60 implemented with respective NMOS transistors 64. The switches 60 may be coupled to the output node 34, which may be biased high through the bias element 38.

The pulse generator circuits 42-h, logic circuits 50a-h, and switches 60 used in the switching circuit 30 may operate in essentially the same manner as these same components used in the serializers 40 and 80 of FIGS. 2 and 5, respectively. Therefore, in the interest of brevity and clarity, an explanation of their function and operation will not be repeated other than to mention that the serial data out may be composed of eight serial data digits corresponding to sets of eight parallel data digits data<0-7>, and the serial data digits may each have a duration extending for 45 degrees of the clock signals ckin<0-7>.

Figure 7:
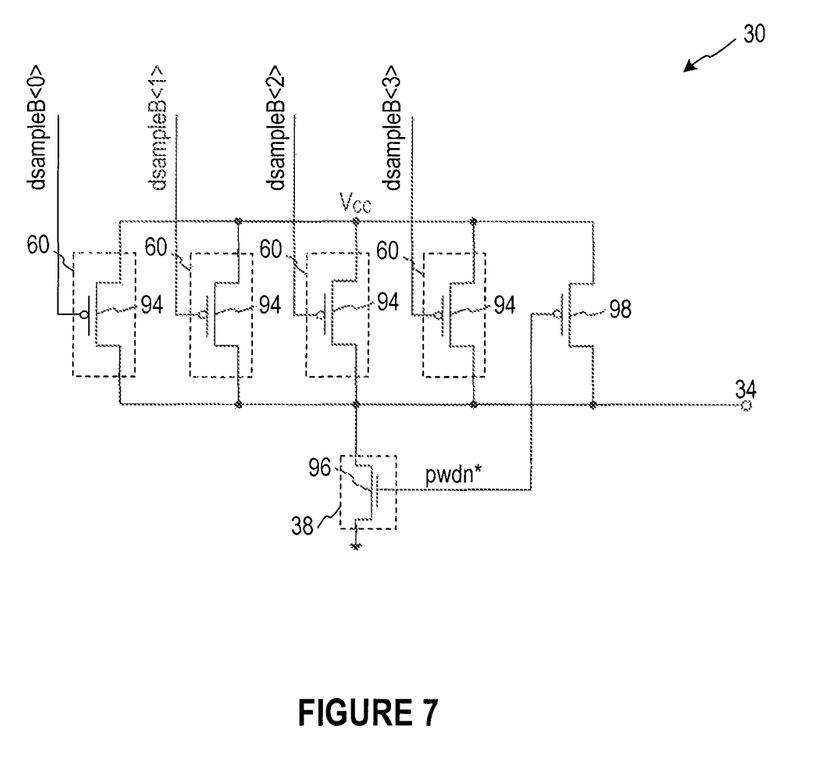
FIG. 7 is a schematic diagram of an embodiment of a switching circuit that may be used in a serializer.

Another embodiment of a switching circuit 30 that may be used in an embodiment of a serializer is shown in FIG. 7. The switching circuit 30 may use a plurality of the switches 60 corresponding to the number of parallel data digits received by the serializer. In the embodiment shown in FIG. 7, 4 switches 60 are used, but the number of switches may be different in other embodiments. However, unlike the previously explained embodiments, the switches 60 may be complementary to the previously described switches insofar as they may be implemented with respective PMOS transistors 94 coupled between the output node 34 and $V_{CC}$. Further, unlike the previously explained embodiments, the bias element 38 may be implemented with an NMOS transistor 96 biasing the output node 34 to ground. Also, the switching circuit 30 may include an additional PMOS transistor 98 coupled in parallel with the transistors 94. The transistors 96, 98 may receive at their respective gates a control signal pwdn*, which may be active low to maintain the output node 34 at $V_{CC}$ when the serializer containing the switching circuit is inactive. When the serializer is active, the control signal pwdn* may be inactive high to turn OFF the transistor 98 and turn on the transistor 96 to bias the output node 34 to ground. Unlike the previously described serializers, the serializer 30 shown in FIG. 7 outputs serial data that corresponds to the complement of the signal levels of the sample signals dsampleB<0-3> so that the serial data corresponds to the signal levels of the respective data bits data <0-3>.

Figure 8:
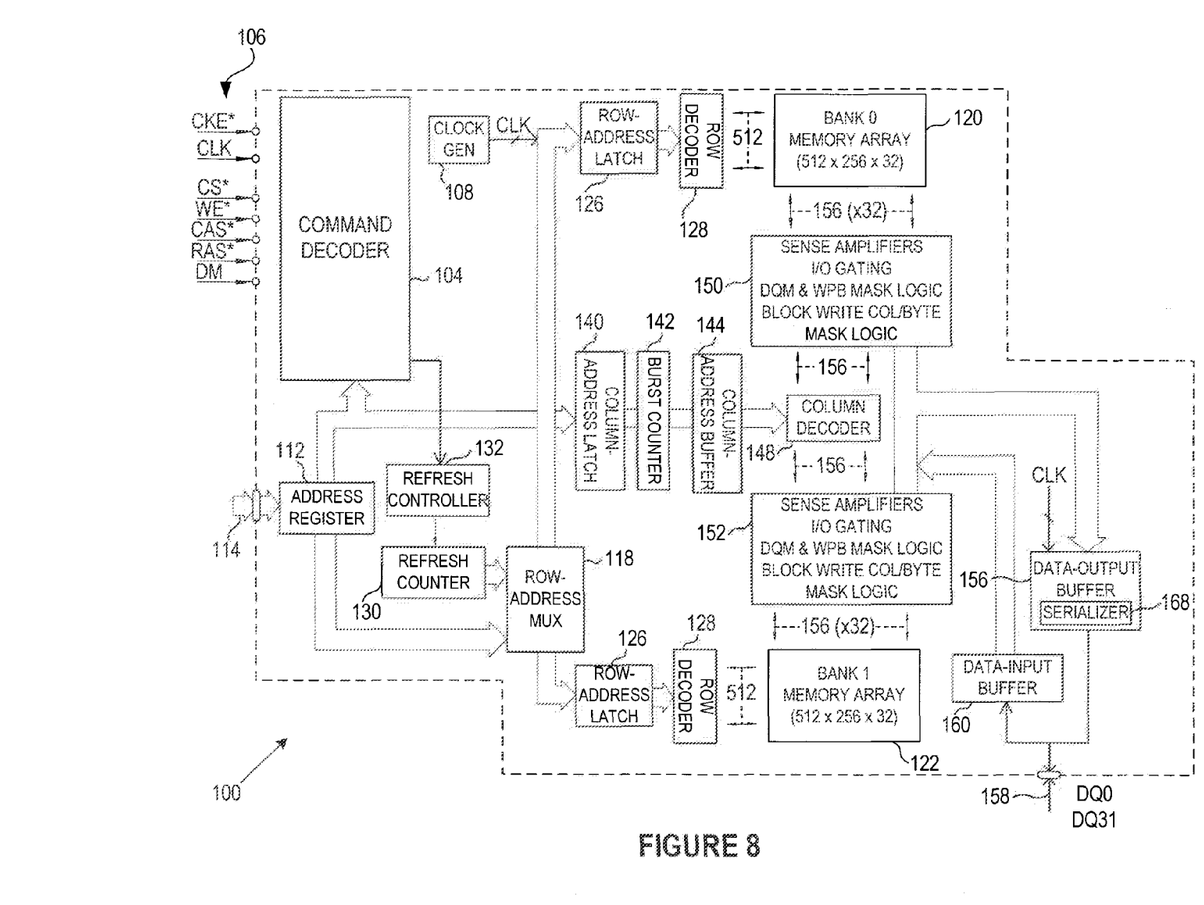
FIG. 8 is a block diagram of an embodiment of a memory device that may use an embodiment of a serializer in a data output buffer.

The serializers 20, 40, 80, 90 or a serializer according to some other embodiment may be used in a wide variety of applications. For example, the serializer embodiments may be used in data output buffers, such as data output buffers used in a memory device as shown in FIG. 8. The memory device may be a conventional synchronous dynamic random access memory ("SDRAM") 100 including a command decoder 104 for controlling its operation responsive to high-level command signals received on a control bus 106. The command decoder 104 may generate a sequence of command signals responsive to the high level command signals to carry out the function (e.g., a read or a write) designated by each of the high level command signals. The SDRAM may also include a clock generator 108 configured to generate a plurality of clock signals having respective phases that differ from each other. As explained below, the number of clock signals CLK generated by the clock generator 108 may correspond to at least the number of parallel digits of read data output from arrays of memory cells. Additionally, the clock signals CLK generated by the clock generator 108 may have phases that differ from each other by equal amounts. For example, if 8 clock signals CLK are generated, they may have respective phases of 0, 45, 90, 135, 180, 225, 270, and 315 degrees.

The SDRAM 100 may include an address register 112 that may receive row addresses and column addresses through an address bus 114. The address bus 114 is generally coupled to a memory controller (not shown in FIG. 8). A row address is generally first received by the address register 112 and applied to a row address multiplexer 118. The row address multiplexer 118 may couple the row address to a number of components associated with either of two memory banks 120, 122 depending upon the state of a bank address digit forming part of the row address. A respective row address latch 126 may be associated with each of the memory banks 120, 122 for storing the row address. A row decoder 128 may decode the row address and apply corresponding signals to one of the banks 120 or 122. The row address multiplexer 118 may also couple row addresses to the row address latches 126 for the purpose of refreshing the memory cells in the banks 120, 122. The row addresses may be generated for refresh purposes by a refresh counter 130, which may be controlled by a refresh controller 132. The refresh controller 132 may, in turn, be controlled by the command decoder 104.

After the row address has been applied to the address register 112 and stored in one of the row address latches 126, a column address may be applied to the address register 112. The address register 112 may couple the column address to a column address latch 140. Depending on the operating mode of the SDRAM 100, the column address may be either coupled through a burst counter 142 to a column address buffer 144, or to the burst counter 142, which may apply a sequence of column addresses to the column address buffer 144 starting at the column address output by the address register 112. In either case, the column address buffer 144 may apply a column address to a column decoder 148.

Data to be read from one of the banks 120, 122 may be coupled in parallel form to column circuitry 150, 152, which may include sense amplifiers, I/O gating, DQM & WPB mask logic, block write col/byte mask logic for one of the arrays 120, 122, respectively. The data digits developed by the sense amplifiers may then be coupled in parallel form to a data output buffer 156. The data output buffer 156 may include a serializer 168 configured to convert the received parallel data to corresponding serial data. The serializer 168 may also receive the CLK signals from the clock generator 108, which, as explained above, may have phases that differ from each by equal amounts. The serializer 168 may be one of the serializers 20, 40, 80, 90 or a serializer according to some other embodiment. The serial read data from the data output buffer 156 is transmitted from the SDRAM 100 through a serial data port 158. Data to be written to one of the arrays 120, 122 may be coupled from the serial data port 158 to the data input buffer 160 in serial form. The data input buffer 160 may deserialize the serial input data to convert the serial data to corresponding parallel data to be coupled to the banks 120, 122 in parallel form. Data input buffers having this capability are conventional.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

I claim:
1. A data serializer, comprising:
a logic system configured to receive a plurality of parallel data digits and a corresponding plurality of clock signals having different phases, the logic system being configured to generate a plurality of data sample signals each of which has a respective value corresponding to the value of respective one of the parallel data digits, responsive to a transition of a respective one of the clock signals; and
a switching circuit comprising a plurality of switches coupled to each other in parallel between an output node and a voltage, each of the switches being coupled to the logic system to receive a respective one of the data sample signals, each of the switches being configured to be controlled by the received data sample signal.

2. The data serializer of claim 1, further comprising a pulse generator configured to generate a plurality of pulses, each of the pulses being generated responsive to a transition of a respective one of the clock signals.

3. The data serializer of claim 2, wherein the logic system is configured to generate each data sample signal responsive to a respective on of the plurality of pulses.

4. The data serializer of claim 2, wherein the logic system comprises a plurality of logic devices, each logic device having a first input coupled to receive a respective one of the plurality of parallel data digits and a second input coupled to receive a respective one of the plurality of pulses, each logic device being configured to be enabled by the respective received pulse.

5. The data serializer of claim 4, wherein each logic device comprises a respective NOR gate.

6. The data serializer of claim 1, wherein the plurality of switches each comprise respective transistors.

7. The data serializer of claim 6, wherein each of the transistors comprise an NMOS transistor.

8. The data serializer of claim 6, wherein each of the transistors comprise a PMOS transistor.

9. The data serializer of claim 1, further comprising an output buffer coupled to the output node.

10. A data serializer, comprising:
a switching circuit comprising a plurality of transistors of a first type coupled to each other in parallel between an output node and a voltage, wherein each of the plurality of transistors of the first type has a respective gate, each gate configured to receive a respective data digit at a particular time, and wherein each particular time differs from the particular times at which each other respective gates of each of the plurality of transistors of the first type receive respective data digits; and
a bias element comprising a transistor of a second type that is different from the first type, the transistor of the second type being biased in an on condition during operation of the data serializer.

11. The data serializer of claim 10, wherein the transistors of the first type comprise respective NMOS transistors, and the transistor of the second type comprises a PMOS transistor.

12. The data serializer of claim 10, wherein the transistors of the first type comprise respective PMOS transistors, and the transistor of the second type comprises an NMOS transistor.

13. A method of serializing a plurality of parallel data digits, comprising:

generating a plurality of data sample signals each having a value corresponding to a respective parallel data digit, the data sample signals being generated at different particular times; and switching an output node to a voltage responsive to each of the data sample signals.

14. The method claim 13, wherein the act of generating the data sample signals at different particular times comprises generating the data sample signals at different particular times equally spaced from each other.

15. The method claim 13, wherein the act of switching an output node to a voltage responsive to each of the data sample signals comprises selectively turning on each of a plurality of transistors that are coupled to each other in parallel between the output node and the voltage.

16. The method claim 13, further comprising buffering between the output node and a serial data port.

17. A memory device comprising:
a clock generator configured to generate a plurality of clock signals having respective phases that differ from each other;
a pulse generator configured to generate a plurality of pulses, each of the pulses being generated responsive to a transition of a respective one of the clock signals;
a deserializer coupled to a serial data port and an array of memory cells, the deserializer being configured to convert serial data into corresponding parallel data digits and provide the parallel data digits to the array of memory cells;
a logic system comprising a plurality of logic devices, each of the logic devices having a first input coupled to receive a respective parallel data digit and a second input coupled to receive a respective one of the pulses, the logic devices being configured to be enabled by the respective received pulses; and
a serializer coupled to the serial data port and the array of memory cells, the serializer being configured to convert the parallel data digits received from the array of memory cells to corresponding serial data and to couple the serial data to the serial data port.

18. The memory device of claim 17, wherein the clock signals generated by the clock generator have respective phases that differ from each other by substantially equal amounts.

19. The memory device of claim 17, further comprising an output buffer coupled between the serializer and the serial data port.

20. The memory device of claim 17, wherein the deserializer comprises an input buffer.

* * * * *

UNITED STATES PATENT AND TRADEMARK OFFICE
CERTIFICATE OF CORRECTION

PATENT NO. : 8,743,642 B2
APPLICATION NO. : 13/491311
DATED : June 3, 2014
INVENTOR(S) : Seong-Hoon Lee It is certified that error appears in the above-identified patent and that said Letters Patent is hereby corrected as shown below:

In the Claims

In column 9, line 7, in Claim 14, after "method" insert -- of --.
In column 9, line 10, in Claim 15, after "method" insert -- of --.
In column 9, line 15, in Claim 16, after "method" insert -- of --.

Signed and Sealed this
Twenty-sixth Day of August, 2014

Michelle K. Lee
*Deputy Director of the United States Patent and Trademark Office*